(12) United States Patent
Tang

(10) Patent No.: US 12,382,696 B2
(45) Date of Patent: Aug. 5, 2025

(54) SEMICONDUCTOR STRUCTURE AND METHOD FOR MANUFACTURING SAME

(71) Applicant: CHANGXIN MEMORY TECHNOLOGIES, INC., Hefei (CN)

(72) Inventor: Jifeng Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 393 days.

(21) Appl. No.: 17/954,582

(22) Filed: Sep. 28, 2022

(65) Prior Publication Data

US 2023/0013284 A1    Jan. 19, 2023

Related U.S. Application Data

(63) Continuation of application No. PCT/CN2022/093898, filed on May 19, 2022.

(30) Foreign Application Priority Data

Jan. 13, 2022 (CN) .......... 202210037826.X

(51) Int. Cl.
*H10D 64/23* (2025.01)
*H01L 21/285* (2006.01)
(Continued)

(52) U.S. Cl.
CPC ..... *H10D 64/251* (2025.01); *H01L 21/28518* (2013.01); *H10D 64/01* (2025.01); *H10D 64/62* (2025.01)

(58) Field of Classification Search
CPC .......... H10D 30/6219; H10D 30/6729; H10D 30/0212–0213; H10D 30/794;
(Continued)

(56) References Cited

U.S. PATENT DOCUMENTS 8,455,952 B2   6/2013 Lin et al.
9,299,711 B2   3/2016 Song et al.
(Continued)

FOREIGN PATENT DOCUMENTS

CN   102479789 A   5/2012
CN   105405785 A   3/2016
(Continued)

OTHER PUBLICATIONS

"Pre-bond TSV Test Method Using Custom Pad", May 2018, Fang Xu, Yu Yang, Peng Xiyuan, Chinese Journal of Scientific Instrument, vol. 39, No. 5, 11 pgs.
(Continued)

*Primary Examiner* — Wasiul Haider
(74) *Attorney, Agent, or Firm* — Syncoda LLC; Feng Ma

(57) ABSTRACT

A semiconductor structure and a manufacturing method thereof are provided. The semiconductor structure includes a substrate, a gate structure being provided on a surface of the substrate, and a source region and a drain region being provided in the substrate at two sides of the gate structure, respectively; and a contact located on the substrate, the contact including a first contact located on the substrate and a second contact located on a side of the first contact away from the substrate, in which an area of a bottom surface of the first contact is greater than an area of a top surface of the second contact.

7 Claims, 19 Drawing Sheets

(51) Int. Cl.
*H10D 64/01* (2025.01)
*H10D 64/62* (2025.01)

(58) Field of Classification Search
CPC .... H10D 84/013; H10D 64/251; H10D 64/62; H01L 21/768; H01L 23/48; H01L 23/481; H01L 21/76895
See application file for complete search history.

(56) References Cited

U.S. PATENT DOCUMENTS

| | | | |
|---|---|---|---|
| 10,205,090 B2 | 2/2019 | Lee | |
| 10,985,211 B1 | 4/2021 | Lee | |
| 11,114,444 B2 | 9/2021 | Tsai | |
| 11,482,602 B2 | 10/2022 | Song et al. | |
| 2007/0246787 A1 | 10/2007 | Wang | |
| 2011/0093224 A1 | 4/2011 | Ide | |
| 2012/0126331 A1 | 5/2012 | Lin et al. | |
| 2014/0085966 A1 | 3/2014 | Song et al. | |
| 2017/0269150 A1 | 9/2017 | Kang et al. | |
| 2020/0118873 A1* | 4/2020 | Tsai | H01L 21/28088 |
| 2020/0303264 A1 | 9/2020 | Park et al. | |
| 2020/0373308 A1 | 11/2020 | Tsai | |
| 2021/0143214 A1 | 5/2021 | Lee et al. | |
| 2021/0215755 A1 | 7/2021 | Lin | |
| 2021/0217861 A1 | 7/2021 | Song et al. | |
| 2021/0375758 A1* | 12/2021 | Huang | H01L 21/76885 |
| 2022/0093790 A1* | 3/2022 | Glass | H10D 62/824 |
| 2022/0270971 A1 | 8/2022 | Wang et al. | |
| 2023/0130088 A1* | 4/2023 | Xie | H01L 21/76897 257/288 |

FOREIGN PATENT DOCUMENTS

| | | |
|---|---|---|
| CN | 106199382 A | 12/2016 |
| CN | 206057425 U | 3/2017 |
| CN | 106771985 A | 5/2017 |
| CN | 103681865 B | 3/2018 |
| CN | 111323694 A | 6/2020 |
| CN | 111987071 A | 11/2020 |
| CN | 112068011 A | 12/2020 |
| CN | 112151377 A | 12/2020 |
| CN | 112786562 A | 5/2021 |
| CN | 113113488 A | 7/2021 |
| EP | 2541415 A1 | 1/2013 |

OTHER PUBLICATIONS

Non final office action in U.S. Appl. No. 18/149,219, mailed on May 6, 2025.

* cited by examiner

SEMICONDUCTOR STRUCTURE AND METHOD FOR MANUFACTURING SAME

CROSS-REFERENCE TO RELATED APPLICATIONS

This application is a continuation application of International Application No.: PCT/CN2022/093898, filed on May 19, 2022, which claims priority to Chinese Patent Application No.: 202210037826.X, filed on Jan. 13, 2022. The disclosures of International Application No.: PCT/CN2022/093898 and Chinese Patent Application No.: 202210037826.X are hereby incorporated by reference in their entireties.

BACKGROUND

With the integration degree of memory elements increasing and the size of the elements shrinking, the line width of the element is gradually shrinking, which leads to an increase of the resistance of a contact in a core region of the element and affects the property of the device.

SUMMARY

The disclosure relates to, but is not limited to a semiconductor structure and a manufacturing method thereof.

In view of this, embodiments of the disclosure provide a semiconductor structure and a method for manufacturing the same.

According to the first aspect of embodiments of the disclosure, a semiconductor structure is provided, which includes: a substrate, a gate structure being provided on a surface of the substrate, and a source region and a drain region being provided in the substrate at two sides of the gate structure, respectively; and a contact located on the substrate, including a first contact located on the substrate and a second contact located on a side of the first contact away from the substrate, in which an area of a bottom surface of the first contact is greater than an area of a top surface of the second contact.

According to the second aspect of the embodiments of the disclosure, a method for manufacturing a semiconductor structure is provided, which includes the following operations.

A substrate is provided, in which a gate structure is provided on a surface of the substrate, and a source region and a drain region are provided in the substrate at two sides of the gate structure, respectively.

A contact is formed on the substrate, which includes a first contact located on the substrate and a second contact located on a side of the first contact away from the substrate.

An area of a bottom surface of the first contact is greater than an area of a top surface of the second contact.

LIST OF REFERENCE NUMERALS

Figure 1A:
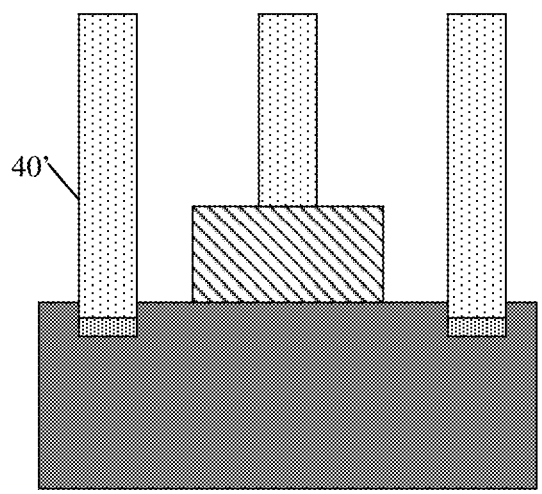
FIG. 1A is a side view of a semiconductor device in the related art.

10—substrate; 11—source region; 12—drain region;
20—gate structure;
30—silicide layer; 130—metal layer;
40', 40—contact; 41—first contact; 42—second contact; 401—through hole; 140—contact pre-layer;
50—interlayer dielectric layer; 60—mask layer;
71—first photomask; 711—first target pattern; 72—photomask; 721—target pattern;
80—photoresist layer; and 81—patterned photoresist layer.

DETAILED DESCRIPTION

In Exemplary embodiments disclosed by the embodiments of the disclosure are described in more detail below with reference to the accompanying drawings. Although the exemplary embodiments of the disclosure are shown in the drawings, it should be understood that the disclosure may be implemented in various forms and should not be limited by the specific embodiments set forth herein. On the contrary, these embodiments are provided for a more thorough understanding of this disclosure, and able to fully convey the scope of this disclosure to those skilled in the art.

In the following descriptions, numerous specific details are set forth in order to provide a more thorough understanding of the disclosure. However, it is apparent to those skilled in the art that the disclosure may be implemented without one or more of these details. In other examples, some technical features that are well known in the art are not described in order to avoid obscuring with the disclosure. That is, not all features of an actual embodiment are described herein, and well-known functions and structures are not described in detail.

In the drawings, the dimensions of layers, areas, elements and their relative dimensions may be enlarged for clarity. The same reference numeral indicates the same element from beginning to end.

It should be understood that when an element or a layer is referred to as being "on", "adjacent to", "connected to" or "coupled to" another element or layer, it may be directly on, adjacent to, connected to or coupled to the element or layer, or an interval element or layer may exist. On the contrary, when an element is referred to as "directly on", "directly adjacent to", "directly connected to" or "directly coupled to" another element or layer, there is no interval element or layer. It should be understood that although the terms first, second, third, etc. may be used to describe various elements, parts, areas, layers and/or parts, these elements, parts, areas, layers and/or parts should not be limited by these terms. These terms are only used to distinguish one element, part, area, layer or part from another element, part, area, layer or part. Therefore, without departing from the teaching of the disclosure, the first element, part, area, layer or part discussed below may be indicated as a second element, part, area, layer or part. When a second element, part, area, layer or part is discussed, it does not mean that the first element, part, area, layer or part certainty exists in the disclosure.

Spatial relation terms such as "below", "under", "lower", "beneath", "above" and "upper" may be used here for convenience of description to describe the relationship between one element or feature shown in the drawings and another element or feature. It should be understood that in addition to the orientations shown in the drawings, the spatial relationship terms are intended to include different orientations of devices in use and operation. For example, if the device in the drawings is turned upside down, then the element or feature described as "under" or "beneath" another element or feature will be oriented "on" the element or feature. Therefore, the exemplary terms "under" and "below" may include two orientations: up and down. The device may be otherwise oriented (rotated by 90 degrees or at other orientations) and the spatial description used here is interpreted accordingly.

The terms used here are only for the purpose of describing specific embodiments and should not be taken as a limitation on the disclosure. As used herein, singular forms of "a/an", "one" and "said/the" are also intended to include plural forms, unless the context clearly dictates otherwise. It should also be understood that the terms "consist of" and/or "comprise/include", when used in this specification, identify the presence of stated feature, integer, step, operation, element and/or part, but do not exclude the presence or addition of one or more other features, integers, steps, operations, elements, parts and/or groups. As used herein, the term "and/or" includes any and all combinations of related listed items.

For thorough understanding of this disclosure, detailed steps and detailed structures are set forth in the following descriptions in order to illustrate the technical solutions of this disclosure. Preferred embodiments of the disclosure are described in detail as follows, however, besides these detailed descriptions, the disclosure may have other embodiments.

Figure 1B:
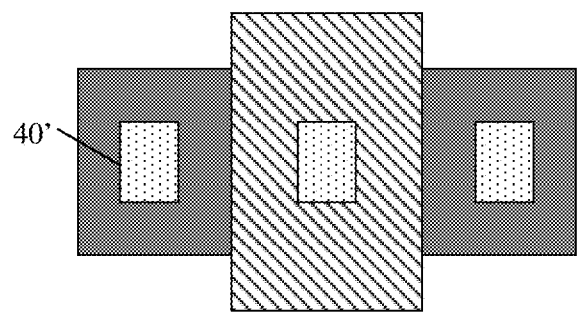
FIG. 1B is a top view of a semiconductor device in the related art.

With the shrinking of the size of dynamic random access memory (DRAM), the size of a corresponding core region device thereof also need to be shrunk. Moreover, due to limitation of the design rule of the core region, the size of a contact in the core region must be reduced, which leads to the contact of the core area device being of a high resistance state, which affects the performance of the device. FIG. 1A is a side view of a semiconductor device of the related art. FIG. 1B is a top view of the semiconductor device of the related art. In the core region, due to an influence of metal routing, the width of the top of the contact 40' is limited, which in turn leads to an increase of the resistance of the contact 40'.

Moreover, as the size of the device becomes smaller and smaller, the junction depth of source and drain becomes shallower, and the depth of the contact in the polysilicon also becomes shallower. A shallow depth contact will be a development way in future.

Figure 2A:
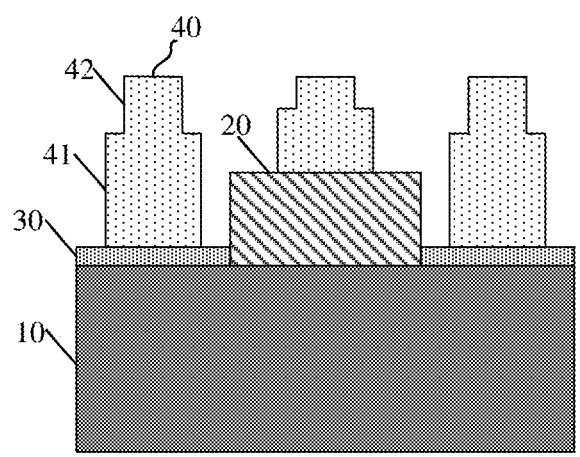
FIG. 2A is a side view of a semiconductor structure provided by an embodiment of the disclosure.

Based on this, an embodiment of the disclosure provides a semiconductor structure. FIG. 2A is a side view of a semiconductor structure provided by the embodiment of the disclosure, and FIG. 2B is a top view of the semiconductor structure provided by the embodiment of the disclosure.

Figure 2B:
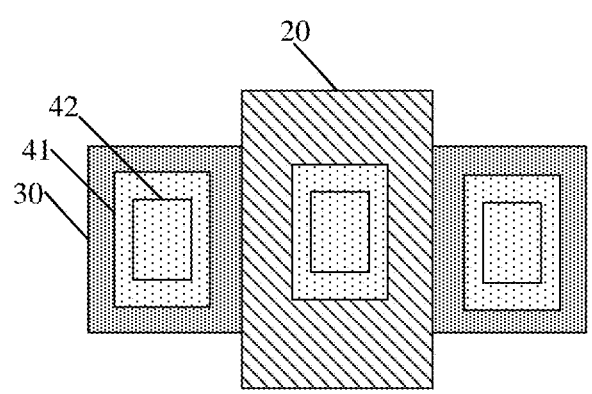
FIG. 2B is a top view of a semiconductor structure provided by an embodiment of the disclosure.

Referring to FIGS. 2A and 2B, the semiconductor structure includes a substrate 10 and a contact 40.

The substrate 10 is provided with a gate structure 20, and a source region and a drain region are provided in the substrate 10 at two sides of the gate structure 20, respectively. It should be noted that, in some embodiments, when the gate structure 20 is a planar-gate structure, the subsequently provided gate is provided on the surface of the substrate 10, and when the gate structure 20 is a buried gate structure, the subsequently provided gate is provided in the substrate 10. In this embodiment, the description is made by taking the gate structure 20 being a planar-gate structure as an example.

The contact 40 is located on the substrate 10 and includes a first contact 41 located on the substrate and a second contact 42 located on a side of the first contact 41 away from the substrate, in which an area of a bottom surface of the first contact 41 is greater than an area of a top surface of the second contact 42. Disposing in this way, the resistance of the first contact 41 is reduced by the increased cross sectional area of the first contact 41, thereby reducing the resistance of the contact 40.

The substrate 10 may be an elementary semiconductor material substrate (for example, a silicon (Si) substrate, a germanium (Ge) substrate), a composite semiconductor material substrate (for example, a germanium-silicon (SiGe) substrate), a silicon-on-insulator (SOI) substrate or a germanium-on-insulator (GeOI) substrate, etc.

The gate structure 20 may include a structure of an oxide layer, a first gate conductive layer, a second gate conductive layer and so on stacked in sequence (not shown in the figures).

In this embodiment, the bottom surface of the first contact 41 and the top surface of the second contact 42 are planes parallel to the plane of the substrate 10. Specifically, the bottom surface of the first contact 41 is the plane of the side of the first contact 41 close to the substrate 10, and the top surface of the second contact 42 is the plane of the side of the second contact of 42 away from substrate 10.

The contact 40 includes a TiN layer close to one side of the substrate and a metal tungsten layer located on the TiN layer (not shown in the figures). A range of the thickness of the TiN layer is 2-10 nm, preferably be 5 nm.

If the metal tungsten layer directly contacts with Si, the adhesiveness is poor, and tungsten is easy to diffuse. Therefore, in this disclosure, the adhesiveness is improved by firstly depositing the TiN layer as an adhesion layer and a barrier layer.

In an embodiment, the first contact 41 and the second contact 42 are integrally formed, which can reduce the interface difference between the first contact 41 and the second contact 42, thereby increasing the stability of the contact 40.

In an embodiment, the semiconductor structure further includes silicide layers 30 respectively located on the substrate 10 of the source region and the drain region, in which a side of each silicide layer 30 away from the substrate 10 is disposed with the contact 40.

In the embodiment of the disclosure, the silicide layers 30 are disposed on the surface of the substrate 10, and cover the surface of the substrate 10 of the source region and the drain region, respectively. In this way, the contact area between the silicide layer and the substrate is increased, thereby reducing the value of resistance.

The material of the silicide layers 30 includes, but is not limited to $TiSi_2$, $CoSi_2$ or $Ni_2Si$.

A range of the thickness of the silicide layers 30 is 10-15 nm.

In an embodiment, an additional contact 40 is disposed on a side of the gate structure 20 away from the substrate 10.

In an embodiment, the area of the bottom surface of the first contact 41 is 2-4 times the area of the top surface of the second contact 42. In this way, the contact area at the bottom of the contact is increased, thereby reducing the resistance value of the contact.

Specifically, for example, the size of the bottom surface of the first contact may be 350 nm*20 nm, i.e. the area of the bottom surface is 7000 nm$^2$, and the size of the top surface of the second contact may be 100 nm*20 nm, i.e. the area of the top surface is 2000 nm$^2$.

In an embodiment, a height of the first contact 41 is 2-4 times that of the second contact 42 in a direction perpendicular to the plane of the substrate 10. Disposing in this way, the stability of the contact 40 is increased and at the same time the resistance of the contact 40 can be reduced as much as possible.

Specifically, for example, the overall height of the contact may be 160 nm, and the height of the first contact may be 120 nm, and the height of the second contact may be 40 nm.

In an embodiment, within a section parallel to the plane of the substrate 10, a sectional area of the first contact 41 is a first sectional area, and a sectional area of the second contact 42 is a second sectional area, and along the direction perpendicular to the plane of the substrate 10, the first sectional area and the second sectional area remain constant, respectively.

Specifically, see FIG. 2A, shapes of side of the first contact 41 and the second contact 42 are rectangles.

In other embodiments, within a section parallel to the plane of substrate 10, a sectional area of the first contact 41 is a first sectional area and a sectional area of the second contact 42 is a second sectional area, and along the direction perpendicular to the plane of the substrate 10 and gradually away from the substrate 10, the first sectional area and the second sectional area gradually decrease, respectively.

Figure 3A:
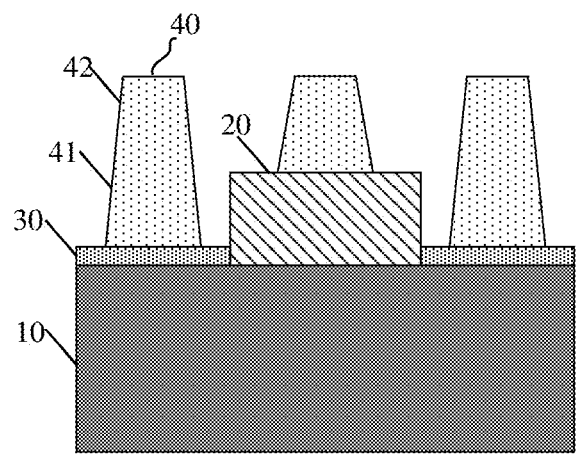
FIGS. 3A to 3B are side views of a semiconductor structures provided by another embodiment of the disclosure.
Figure 3B:
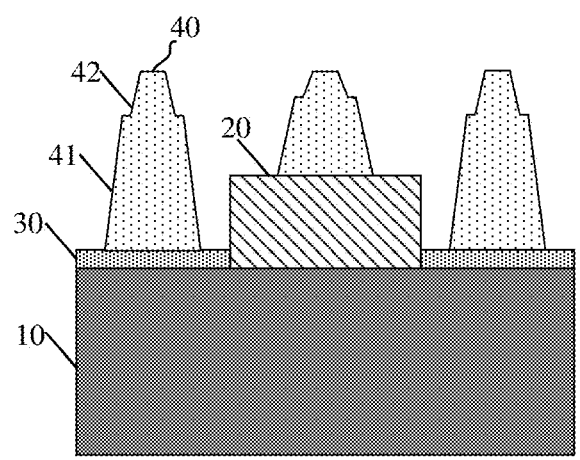

Specifically, see FIGS. 3A and 3B, the shapes of the sides of the first contact 41 and the second contact 42 are isosceles trapezoids, respectively. It should be noted that, as shown in FIG. 3A, the area of the top surface of the first contact 41 may be equal to the area of the bottom surface of the second contact 42. As shown in FIG. 3B, the area of the top surface of the first contact 41 may not be equal to the area of the bottom surface of the second contact 42.

Figure 4:
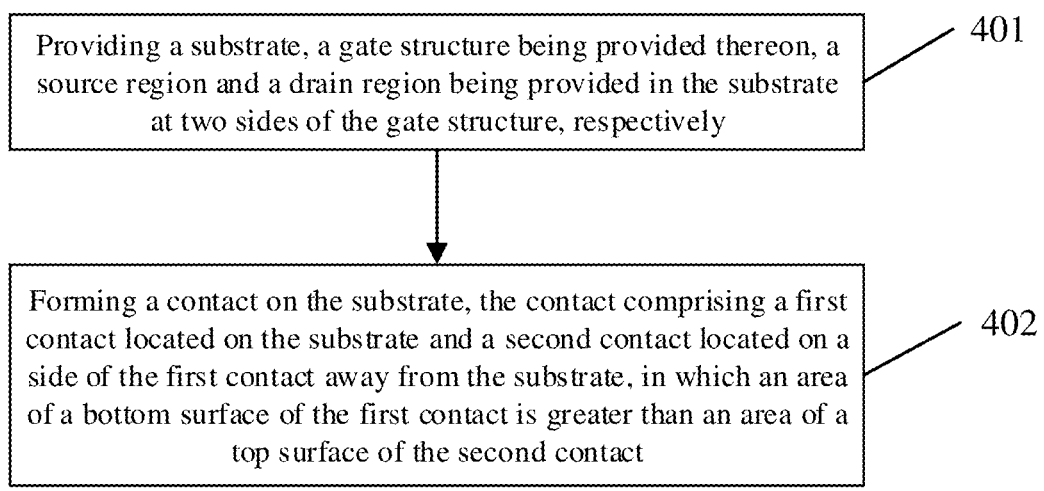
FIG. 4 is a flowchart of a method for manufacturing a semiconductor structure provided by an embodiment of the disclosure.

An embodiment of the disclosure also provides a method for preparing a semiconductor structure; please see FIG. 4 for details. As shown in the figure, the method includes the following operations.

At S401, a substrate is provided. A gate structure is provided on a surface of the substrate, and a source region and a drain region are provided in the substrate at two sides of the gate structure, respectively.

At S402, a contact is formed on the substrate. The contact includes a first contact located on the substrate and a second contact located on a side of the first contact away from the substrate, in which an area of a bottom surface of the first contact is greater than an area of a top surface of the second contact.

The manufacturing method of a semiconductor structure provided by the embodiment of the disclosure is described in further detail below with reference to specific embodiments.

FIGS. 5A to 5L are structural schematic diagram of the manufacturing procedure of a semiconductor structure provided by the embodiment of the disclosure.

Figure 5A:
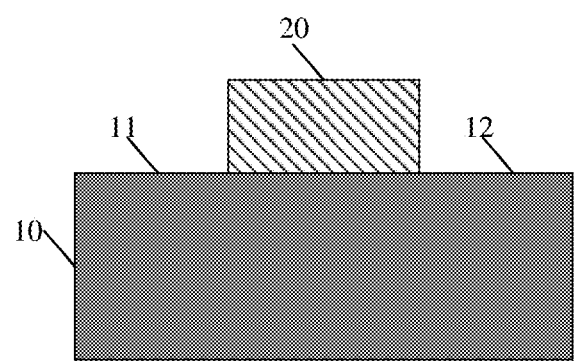
FIGS. 5A to 5L are structural schematic diagrams showing the manufacturing procedure of a semiconductor structure provided by an embodiment of the disclosure.

Firstly, referring to FIG. 5A, S401 is performed, the substrate 10 is provided. A gate structure 20 is provided on the surface of the substrate, and a source region 11 and a drain region 12 are provided in the substrate 10 at the two sides of the gate structure 20, respectively.

The substrate 10 may be an elementary semiconductor material substrate (for example, a silicon (Si) substrate, a germanium (Ge) substrate), a composite semiconductor material substrate (for example, a germanium-silicon (SiGe) substrate), a silicon-on-insulator (SOI) substrate or a germanium-on-insulator (GeOI) substrate, etc.

The gate structure 20 may include structure of an oxide layer, a first gate conductive layer, a second gate conductive layer and so on stacked in sequence (not shown in the figures).

Figure 5B:
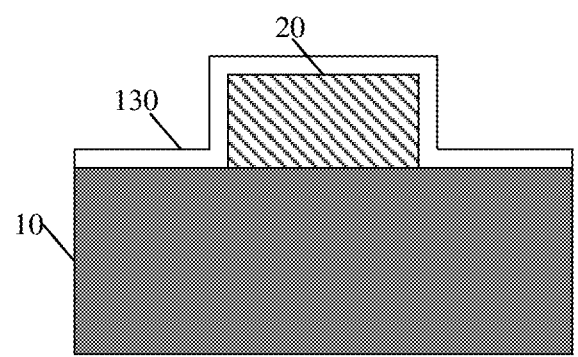
Figure 5C:
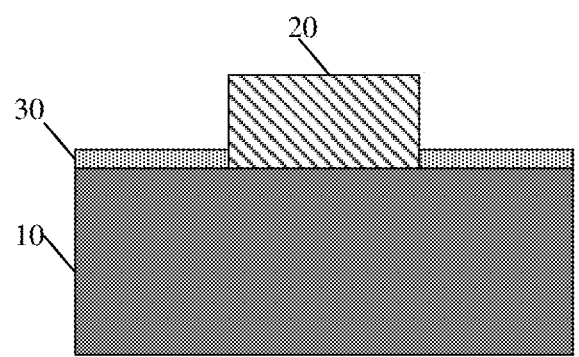

Next, referring to FIGS. 5B to 5C, the method further includes the operation that before performing S402, silicide layers 30 are formed on the substrate 10 of the source region 11 and the drain region 12, respectively, in which a side of each silicide layer 30 away from the substrate 10 is disposed with the contact 40.

Specifically, referring to FIG. 5B, after an ion implantation process is performed on the source region 11 and the drain region 12, a metal layer 130 is deposited on the surface of substrate of the source region 11 and the drain region 12 and on the surface and sidewalls of the gate structure 20.

The material of the metal layer 130 includes, but is not limited to Co, Ti or Ni.

Next, referring to FIG. 5C, in an environment with a temperature of 700-800° C., a rapid thermal process (RTP) is performed for 25-35s, such that the metal layer 130 reacts with Si on the surfaces of the source region 11 and the drain region 12 and forms a silicide layer 30, and the metal layer located on the surface and the sidewalls of the gate structure that does not react with Si is removed. In this way, the silicide layers 30 located on the substrate of the source region 11 and the drain region 12 are formed.

The material of the silicide layers 30 includes, but is not limited to TiSi$_2$, CoSi$_2$ or Ni$_2$Si.

The thickness of the silicide layers 30 is in a range of 10-15 nm.

In the embodiment of the disclosure, the silicide layers are disposed on the surface of the substrate, and respectively cover the surface of the substrate of the source region and the drain region. In this way, the contact area between the silicide layers and the substrate is increased, thereby reducing the value of resistance.

Next, referring to FIGS. 5D to 5I, S402 is performed to form the contact 40 on the substrate 10. The contact 40 includes the first contact 41 located on the substrate 10 and the second contact 42 located on the side of the first contact 41 away from the substrate 10, in which the area of the bottom surface of the first contact 41 is greater than the area of the top surface of the second contact 42.

In an embodiment, forming the contact 40 on the substrate 10 includes: forming an interlayer dielectric layer 50 and a mask layer 60 on the substrate 10 in sequence; etching the interlayer dielectric layer 50 and the mask layer 60 to form a through hole 401; filling the through hole 401 to form a contact pre-layer 140; forming a photoresist layer 80 on the contact pre-layer 140; performing exposure and development on the photoresist layer 80 to transfer a target pattern of a photomask 72 to the photoresist layer 80 to form a patterned photoresist layer 81; and etching the contact pre-layer 140 based on the patterned photoresist layer 81 to form the first contact 41 and the second contact 42.

Specifically, the manufacturing procedure of the contact is described in detail below by taking forming the contact on the substrate of the source region as an example.

Figure 5D:
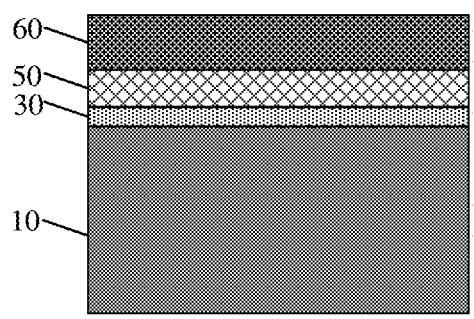

Referring to FIG. 5D, the interlayer dielectric layer 50 and the mask layer 60 are formed on the silicide layer 30 in sequence.

Figure 5E:
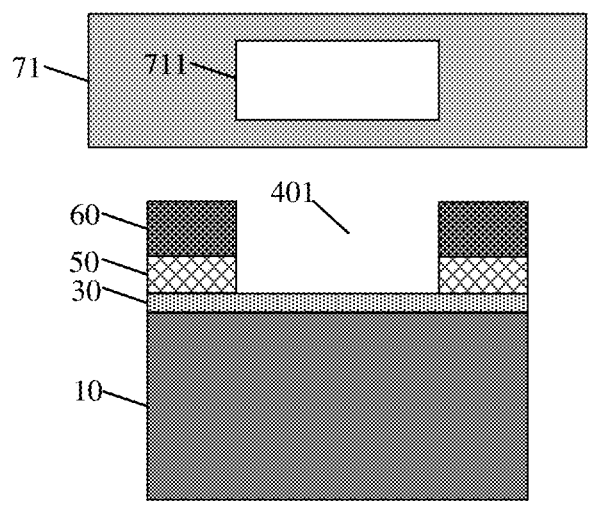

Referring to FIG. 5E, the interlayer dielectric layer 50 and the mask layer 60 are etched based on a first target pattern 711 of a first photomask 71 to form the through hole 401.

Specifically, the mask layer 60 is etched under an environment of $O_2$ or COS for 65s-75s, and the temperature is 10° C.-20° C. The interlayer dielectric layer 50 is etched under an environment of $O_2$ or $CF_4$ for 85s-95s, and the temperature is 10° C.-20° C.

Figure 5F:
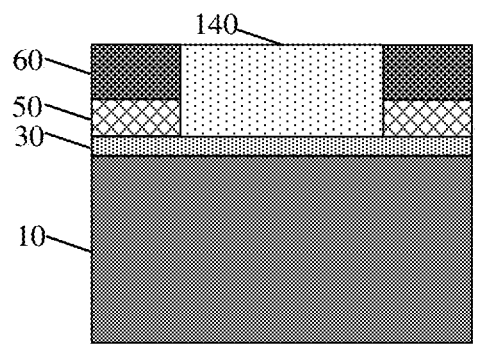

Referring to FIG. 5F, the through hole 401 is filled to form the contact pre-layer 140. Specifically, firstly, in an environment with a temperature of 600° C.-700° C., a TiN layer is deposited in the through hole 401, and the thickness of the TiN layer is 2-10 nm, preferably be 5 nm; next, in an environment with a temperature of 250° C.-350° C., a metal tungsten layer is deposited on the TiN layer until the through hole 401 is filled up, and finally a CMP process is performed on the metal tungsten layer to form the contact pre-layer 140.

If a metal tungsten layer directly contacts with Si, the adhesiveness is poor, and tungsten is easy to diffuse. Therefore, in this disclosure, the adhesiveness is improved by firstly depositing the TiN layer as an adhesion layer and a barrier layer.

Figure 5G:
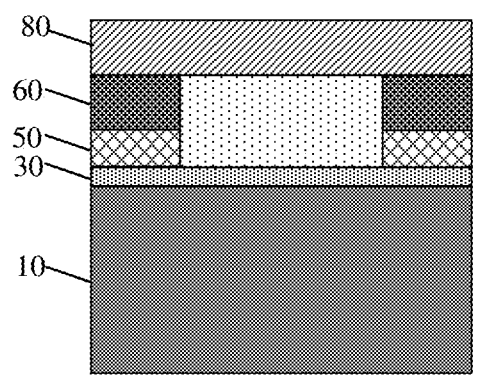

Referring to FIG. 5G, a photoresist layer 80 is formed on the contact pre-layer 140.

Figure 5H:
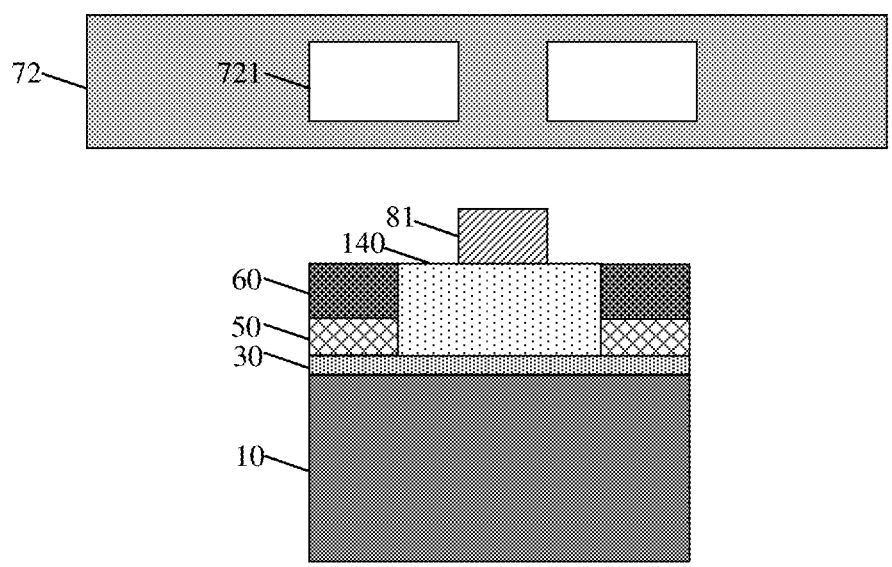

Referring to FIG. 5H, the photoresist layer 80 is performed with exposure and development based on the target pattern 721 of the photomask 72, to transfer the target pattern 721 of the photomask 72 to the photoresist layer 80 to form the patterned photoresist layer 81. The width of the patterned photoresist layer 81 is equal to the width of the top surface of the contact 40.

It is selectable that the photoresist layer 80 may be of a positive photoresist or a negative photoresist. The positive photoresist can form a soluble substance after exposure to light, and the negative photoresist can form an insoluble substance after exposure to light.

Taking the photoresist layer 80 being a positive photoresist as an example, the photomask 72 is arranged right on the photoresist layer 80, and the photomask 72 is provided with the target pattern 721, which can transmit light. Therefore, the part of photoresist of the photoresist layer 80 right facing the target pattern 721 dissolves after being exposed to the light and forms a soluble substance, thereby being removed.

Figure 5I:
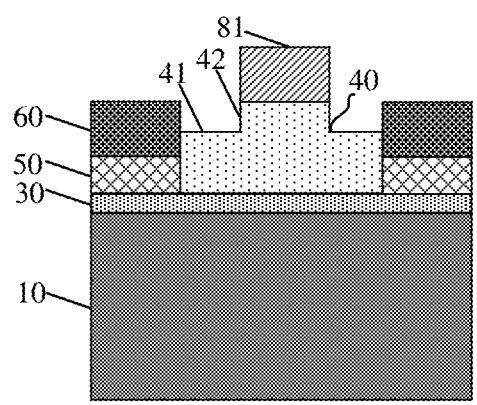

Referring to FIG. 5I, based on the patterned photoresist layer 81, the contact pre-layer 140 is partially etched to form the first contact 41 and the second contact 42.

The above are detailed descriptions of the manufacturing procedure of a contact by taking forming the contact on the source region as an example. It should be noted that the process of forming the contact on the substrate of the drain region and forming the contact on the gate structure are the same as the process of forming the contact on the substrate of the source region.

In an embodiment, the area of the bottom surface of the first contact 41 is 2-4 times the area of the top surface of the second contact 42. In this way, the contact area at the bottom of the contact is increased, thereby reducing the value of resistance of the contact.

Specifically, for example, the size of the bottom surface of the first contact may be 350 nm*20 nm, i.e. the area of the bottom surface is 7000 $nm^2$, and the size of the top surface of the second contact may be 100 nm*20 nm, i.e. the area of the top surface is 2000 $nm^2$.

In an embodiment, a height of the first contact 41 is 2-4 times that of the second contact 42 in a direction perpendicular to the plane of the substrate 10.

Specifically, for example, the overall height of the contact may be 160 nm, and the height of the first contact may be 120 nm, and the height of the second contact may be 40 nm.

Figure 5J:
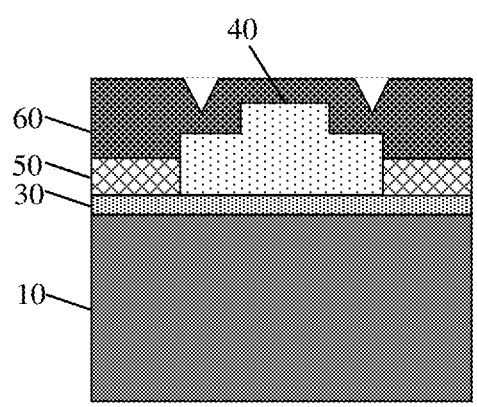
Figure 5K:
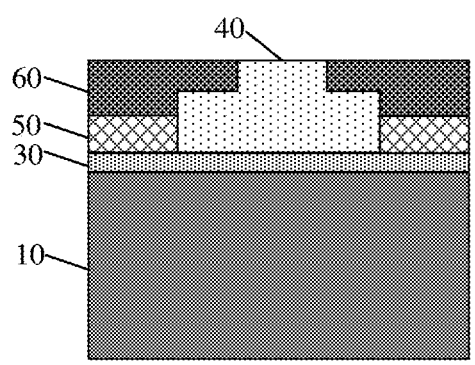

Next, referring to FIGS. 5J and 5K, the patterned photoresist layer 81 is removed, and an additional mask is deposited on surfaces of the mask layer and the contact. The deposited mask layer completely covers the contact 40. Next, the CMP process is performed to remove an excess mask and expose the top surface of contact 40.

Figure 5L:
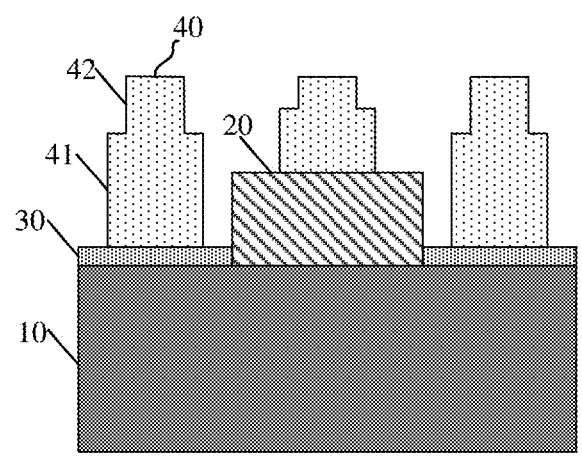

Next referring to FIG. 5L, the interlayer dielectric layer 50 and the mask layer 60 may be removed to form the semiconductor structure as shown in FIG. 5L.

In an embodiment, an additional contact 40 is disposed on a side of the gate structure 20 away from the substrate 10.

In an embodiment, within a section parallel to the plane of the substrate 10, a sectional area of the first contact 41 is a first sectional area, and a sectional area of the second contact 42 is a second sectional area, and along the direction perpendicular to the plane of the substrate 10, the first sectional area and the second sectional area remain unchanged, respectively.

Specifically, referring to FIG. 5L, the shapes of the sides of the first contact 41 and the second contact 42 are rectangles, respectively.

In other embodiments, within a section parallel to the plane of substrate 10, a sectional area of the first contact 41 is a first sectional area and a sectional area of the second contact 42 is a second sectional area, and along the direction perpendicular to the plane of the substrate 10 and gradually away from the substrate 10, the first sectional area and the second sectional area gradually decrease, respectively.

Specifically, referring to FIGS. 3A and 3B, shapes of the sides of the first contact 41 and the second contact 42 are isosceles trapezoids. It should be noted that, as shown in FIG. 3A, the area of the top surface of the first contact 41 may be equal to the area of the bottom surface of the second contact 42. As shown in FIG. 3B, the area of the top surface of the first contact 41 may not be equal to the area of the bottom surface of the second contact 42.

The above are only preferred embodiments of the disclosure, and are not intended to limit the protection scope of the disclosure. Any modification, equivalent replacement and improvement made within the spirit and principle of the disclosure should be included in the protection scope of the disclosure.

The invention claimed is:

1. A method for manufacturing a semiconductor structure, comprising:

providing a substrate, a gate structure being provided on a surface of the substrate, and a source region and a drain region being provided in the substrate at two sides of the gate structure, respectively; and forming a contact on the substrate, the contact comprising a first contact located on the substrate and a second contact located on a side of the first contact away from the substrate, wherein an area of a bottom surface of the first contact is greater than an area of a top surface of the second contact;

wherein forming the contact on the substrate comprises:

forming an interlayer dielectric layer and a mask layer on the substrate in sequence;

etching the interlayer dielectric layer and the mask layer to form a through hole;

filling the through hole to form a contact pre-layer;

forming a photoresist layer on the contact pre-layer, and performing exposure and development on the photoresist layer to transfer a target pattern of a photomask to the photoresist layer and to form a patterned photoresist layer; and based on the patterned photoresist layer, partially etching the contact pre-layer to form the first contact and the second contact.

2. The method according to claim 1, further comprising:
forming silicide layers on the substrate of the source region and the drain region, wherein a side of each of the silicide layers away from the substrate is disposed with the contact, before forming the contact.

3. The method according to claim 1, wherein,
a side of the gate structure away from the substrate is disposed with the contact.

4. The method according to claim 1, wherein,
the area of the bottom surface of the first contact is 2-4 times the area of the top surface of the second contact.

5. The method according to claim 1, wherein,
a height of the first contact is 2-4 times that of the second contact along a direction perpendicular to a plane of the substrate.

6. The method according to claim 1, wherein, within a section parallel to a plane of the substrate, a sectional area of the first contact is a first sectional area, and a sectional area of the second contact is a second sectional area; and along a direction perpendicular to the plane of the substrate, the first sectional area and the second sectional area remain constant, respectively.

7. The method according to claim 1, wherein, within a section parallel to a plane of the substrate, a sectional area of the first contact is a first sectional area, and a sectional area of the second contact is a second sectional area; and along a direction perpendicular to the plane of the substrate and gradually away from the substrate, the first sectional area and the second sectional area gradually decrease, respectively.

* * * * *